(12) United States Patent
Thomas

(10) Patent No.: US 6,326,689 B1
(45) Date of Patent: Dec. 4, 2001

(54) BACKSIDE CONTACT FOR TOUCHCHIP

(75) Inventor: Danielle A. Thomas, Dallas, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/360,802

(22) Filed: Jul. 26, 1999

(51) Int. Cl.[7] .......................... H01L 23/12; H01L 23/04; H01L 23/48
(52) U.S. Cl. ..................... 257/734; 257/730; 257/773; 257/774
(58) Field of Search ............................... 257/734, 735, 257/697, 698, 730, 773, 774, 775, 781

(56) References Cited

U.S. PATENT DOCUMENTS

| | | | |
|---|---|---|---|
| 3,648,131 | * 3/1972 | Stuby ................................ | 317/235 |
| 3,761,782 | * 9/1973 | Youmans ............................ | 29/589 |
| 4,426,769 | * 1/1984 | Grabbe .............................. | 257/704 |
| 5,122,856 | 6/1992 | Komiya ............................. | 257/774 |
| 5,869,889 | * 2/1999 | Chia et al. ........................ | 257/701 |
| 5,910,687 | * 6/1999 | Chen et al. ........................ | 257/784 |
| 6,075,712 | * 6/2000 | McMahon .......................... | 361/783 |
| 6,124,634 | * 9/2000 | Akram et al. ...................... | 257/698 |

FOREIGN PATENT DOCUMENTS

| | | | |
|---|---|---|---|
| 0 316 799 A1 | 11/1988 | (EP) ............................. | H01L/23/52 |
| 22 150 749 A | 7/1985 | (GB) ............................. | H01L/23/50 |
| WO 98/27588 | 6/1998 | (WO) ........................... | H01L/23/485 |

OTHER PUBLICATIONS

Carsten Christensen, Peter Kersten, Sascha Henke and Siebe Bouwstra, Wafer Through–Hole Interconnections with High Vertical Wirig Densities, Dec. 1996, IEEE Transactions on Components, Packaging, and Manufacturing Technology—Part A, vol. 19, No. 4, pp. 516–521.

David Francis and Linda jardine, "A Visible Way to Use Chip–Scale for Discrete Devices", Chip Scale Review, Mar./Apr. 1999, pp. 58–59.

* cited by examiner

*Primary Examiner*—Jhihan B Clark
(74) *Attorney, Agent, or Firm*—Lisa K. Jorgenson; Daniel E. Venglarik

(57) ABSTRACT

A contact is formed within an active region of a substrate at the edge of a die, preferably within the first metallization level in the active region of the substrate. An opening having sloped sidewalls is then etched into the back side of the substrate, exposing a portion of the active region contact. An interconnect is formed on the opening sidewall to connect the active region contact with a die contact pad on the backside surface of the substrate. The active region contact preferably spans a boundary between two die, with the opening preferably etched across the boundary to permit inter-connects on opposing sidewalls of the opening to each contact the active region contact within different die, connecting the active region contact to die contact pads on different dice. The dice are then separated along the boundary, through the active region contact which becomes two separate active region contacts. By forming a shared contact opening spanning two dice, the backside contact is formed around the die edge and the backside surface area necessary for the contact opening is minimized. The backside contact allows direct placement of the integrated circuit die on contacts within the packaging, such as a ball grid array, eliminating the need for wire bonds. The need for a pad etch through passivation material overlying active devices on the front side of the die is also eliminated, and no mask levels are added for the devices formed on the front side.

20 Claims, 5 Drawing Sheets

BACKSIDE CONTACT FOR TOUCHCHIP

RELATED APPLICATIONS

The present invention is related to the subject matter of commonly assigned, copending U.S. patent applications Ser. No. 09/360,836 entitled "BACKSIDE BUS VIAS" and filed Jul. 26, 1999. The content of the above-referenced application is incorporated herein by reference.

BACKGROUND OF THE INVENTION

1. Field of the Invention

The present invention relates generally to die contacts in integrated circuits, and more specifically to backside contact pads employed in lieu of conventional peripheral contact pads.

2. Description of the Prior Art:

Integrated circuits have conventionally employed contact pads on the "front" side of a wafer, or the side of a wafer on which devices are or were formed. The contacts pads, normally square-shaped and approximately 100 μm on a side, are usually located around a peripheral portion of each die. Wires, typically gold, are then formed to connect each die contact pad to an appropriate pad in the packaging, which is generally electrically connected, in turn, to a pin.

Since die contact pads are generally formed using every metallization layer on the front side and are never formed over active devices, placement of the contact pads on the wafer's front side may increase the size requirement of the die. If a large number of contact pads are required and are placed only around the periphery of the die, the number, size and spacing requirements for the contact pads may dictate die size.

For some types of integrated circuits, placement of die contact pads on the front side of the integrated circuit also presents difficult processing challenges. An example is fingerprint acquisition circuits, which employ arrays of capacitive sensor electrodes coated with a dielectric onto which the finger is placed with the epidermis in contact with the dielectric. Since capacitance between two capacitive plates is inversely proportional to the distance between the plates, using the contacting dermal tissue itself as one capacitor plate and the sensor electrode as the other and then determining capacitance for each sensor electrode in the array, it is possible to locate the ridges and grooves of the fingerprint. Because physical contact with the finger is necessary, the hardest possible passivation dielectric coating over the capacitive sensor electrodes is required to prevent "scratch" damage to the sensor electrodes. The capacitive sensor electrodes must be formed in the last metallization layer, as would die contact pads if formed on the front side of the integrated circuit. Either selective formation of the passivation material over the sensor electrodes or selective removal of the passivation material over the contact pads would therefore be required, which may limit the materials which may be employed for the passivation or present other processing challenges. The hardest available passivation material may be effectively "non-etchable."

It would be desirable, therefore, to provide die contact pads in a location other than the front side of a wafer. It would further be advantageous if the die contact pads could be positioned to reduce die size requirements to the area required for active devices within the integrated circuit.

SUMMARY OF THE INVENTION

A contact is formed within an active region of a substrate at the edge of a die, preferably within the first metallization level in the active region of the substrate. An opening having sloped sidewalls is then etched into the back side of the substrate, exposing a portion of the active region contact. An interconnect is formed on the opening sidewall to connect the active region contact with a die contact pad on the backside surface of the substrate. The active region contact preferably spans a boundary between two die, with the opening preferably etched across the boundary to permit interconnects on opposing sidewalls of the opening to each contact the active region contact within different die, connecting the active region contact to die contact pads on different dice. The dice are then separated along the boundary, through the active region contact which becomes two separate active region contacts. By forming a shared contact opening spanning two dice, the backside contact is formed around the die edge and the backside surface area necessary for the contact opening is minimized. The backside contact allows direct placement of the integrated circuit die on contacts within the packaging, such as a ball grid array, eliminating the need for wire bonds. The need for a pad etch through passivation material overlying active devices on the front side of the die is also eliminated, and no mask levels are added for the devices formed on the front side.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1A:
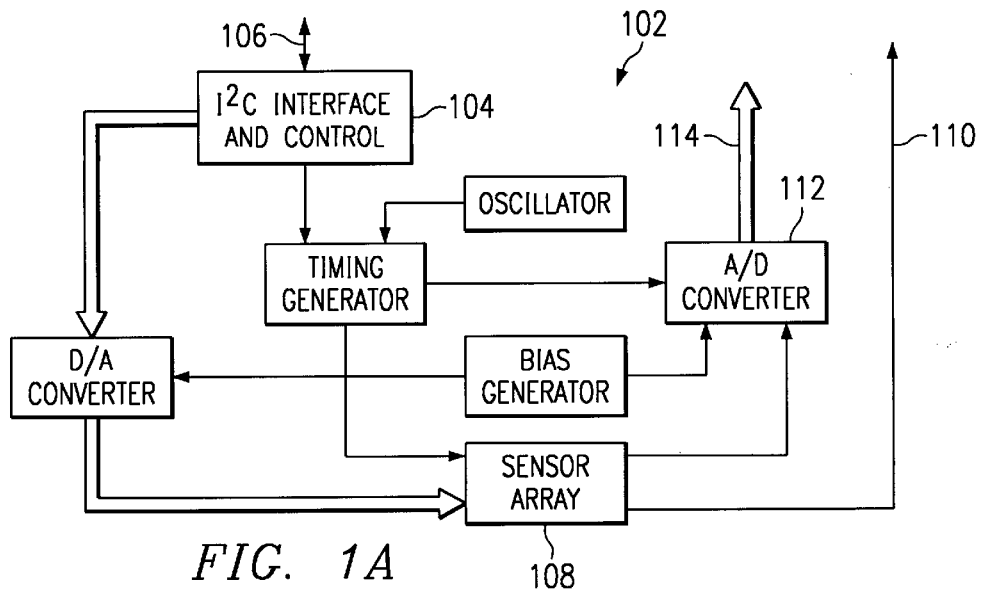
FIGS. 1A–1E depict various views of a sensor circuit employing backside contacts, and the backside contacts, in accordance with a preferred embodiment of the present invention.

With reference now to the figures, and in particular with reference to FIGS. 1A through 1E, various views of a sensor circuit employing backside contacts in accordance with a preferred embodiment of the present invention are depicted. FIG. 1A depicts a block diagram of the sensor circuit 102, which is formed as an integrated circuit on a single die. The sensor circuit 102 and its operation are described more fully in commonly assigned, copending application Ser. No. 09/040,261, entitled "CAPACITIVE DISTANCE SENSOR" and filed May 9, 1998, which is incorporated herein by reference.

The portions of sensor circuit 102 relevant to the present invention include $I^2C$ interface and control device 104, which provides a bidirectional communication protocol enabling sensor circuit 102 to communicate with a controller, such as a microcontroller. $I^2C$ interface and control device 104 exchanges digital signals via control line 106 with controller circuitry (not shown) external to sensor circuit 102. Sensor circuit 102 also includes an array 108 of capacitive sensors for fingerprint acquisition by sensing distances between capacitive electrodes within the sensor array 108 and ridges and grooves on a finger placed in contact with sensor array 108. Sensor array 108 is coupled to the external controller circuit via synchronization line 110. Through synchronization line 110 sensor array 108 provides synchronization signals allowing detected voltages representative of the capacitive value of individual capacitive electrodes within sensor array 108, and therefore representative of the distance between the capacitive electrode and the portion of the epidermal layer contacting sensor array 108 in the region of the capacitive electrode, to be properly interpreted by the external controller. Sensor circuit 102 also includes an analog-to-digital (A/D) converter 112 processing analog voltage measurements received from sensor array 108 and generating digital representations recognized by the external controller as distance measurements of the analog measured voltages from individual capacitive electrodes within sensor array 108. A/D converter 112 transmits these digital signals to the external controller on output bus 114.

Control line 106, synchronization line 110, and output bus 114 each require electrical connection to signal lines external to the die on which sensor circuit 102 is formed. Therefore a die contact pad is needed for each conductive line included within control line 106, synchronization line 110, and output bus 114. Die contact pads may also be required for other signal lines. Each die contact pad is formed on the backside of the die in accordance with the present invention, as described in further detail below.

Figure 1B:
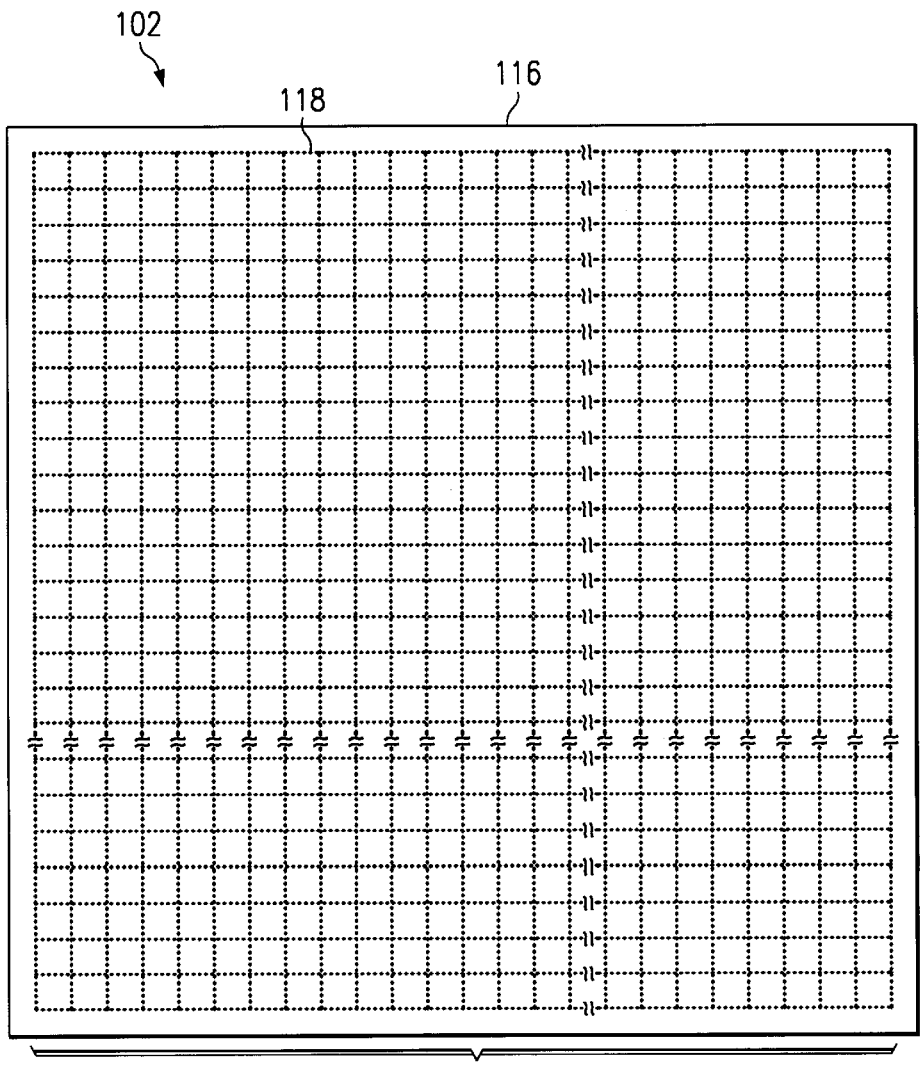

FIG. 1B is a pictorial representation of the "front" side of sensor circuit 102; that is, FIG. 1B depicts the major surface of the die 116 on which the active devices constituting sensor circuit 102 are formed. Sensor array 108 is located on the front side of die 116 and includes a plurality of cells 118, each containing one or more capacitive electrodes. Sensor array 108 in the exemplary embodiment contains square cells approximately 45–50 μm on a side, forming a 250×350 array of contiguous cells 118 within sensor array 108. Sensor array 108 is covered by a passivation material overlying the capacitive electrodes within each cell 118. Other active devices required to form sensor circuit 102 are formed below the capacitive electrodes. Conductive lines to the backside die contact pads are formed around the edge(s) of die 116, as described below.

Figure 1C:
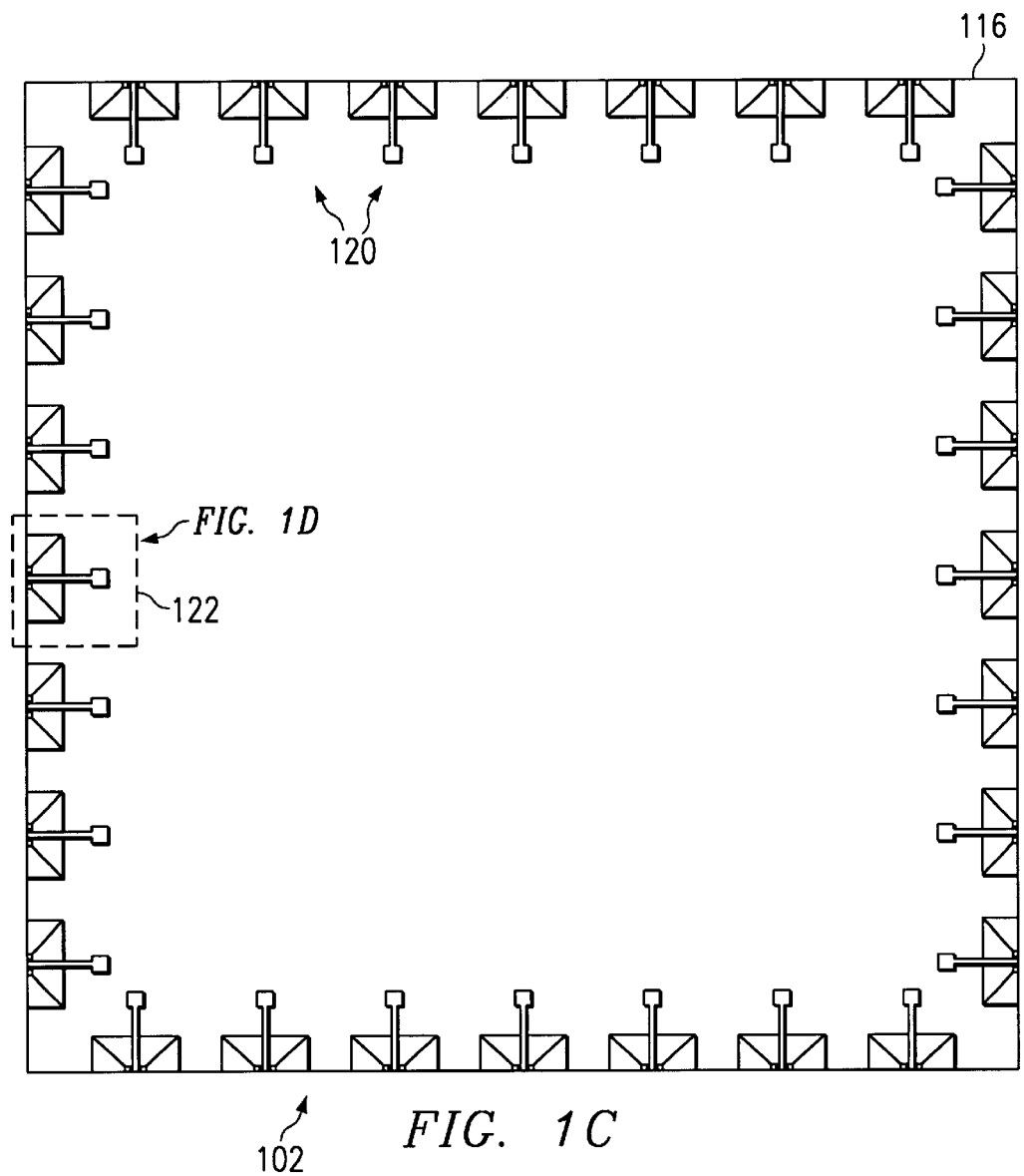

FIG. 1C is a pictorial representation of the backside of sensor circuit 102 formed on die 116. A number of backside die contacts 120 are formed on the back of die 116 at the edges. The number of backside die contacts 120 shown in FIG. 1C is not necessarily the number required for sensor circuit 102, or the number which may be fit on a die, but is merely illustrative of the present invention's capability to support multiple backside contacts formed around any edge of the die 116. In general, integrated circuits typically employ 22 to 46 pads along each edge of a die; sensor circuit 102 utilizes 42 mpads along each die edge, formed as backside contacts.

Figure 1D:
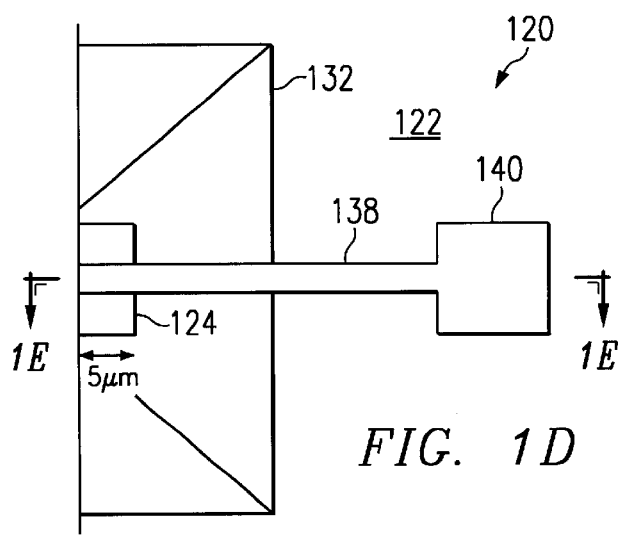
Figure 1E:
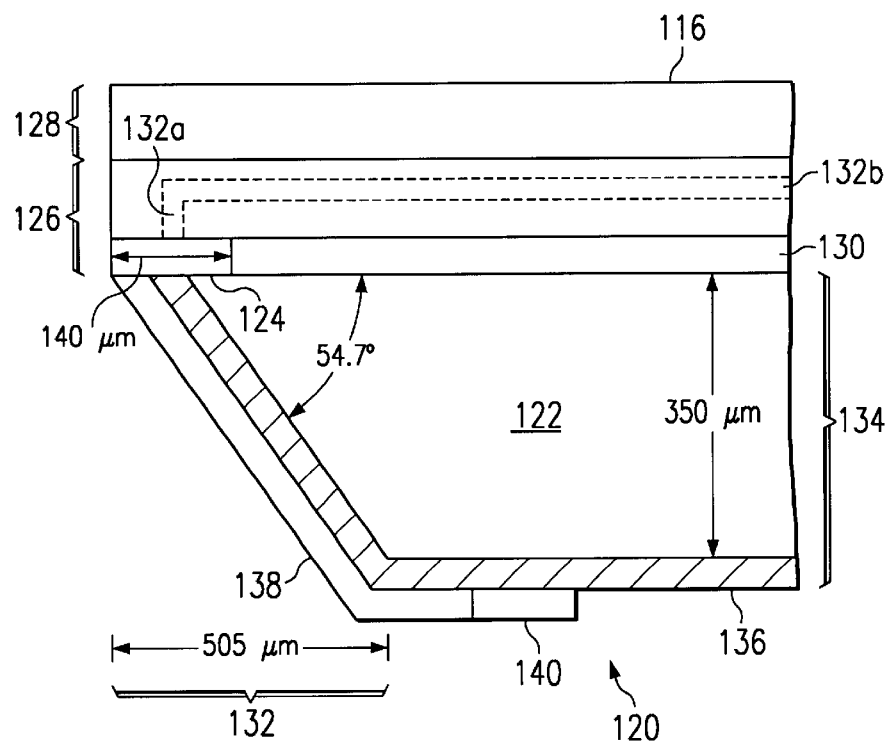

FIG. 1D is a plan view detail of region 122 shown in FIG. 1C, while FIG. 1E is a cross-section of region 122 taken at section line A—A, with the front side of the die 116 at the top and the backside at the bottom. FIGS. 1D and 1E are intended to be considered together. The backside die contact 120 includes an active region contact 124 formed within the active region 126, or the region in which active devices—including capacitive sensor electrodes—are formed, of die 116. The active region contact 124 extends from the edge of die 116 inward with a width of approximately 140 μm and a length along the die edge which can vary from 140 μm to 350 μm. Active region contact 124 is preferably formed in the first metallization layer within active region 126, although other metallization levels may be employed. Active region contact 124 may thus be formed of conductive polysilicon during formation of gate electrodes, or of aluminum, tungsten or any metal layer during formation of contacts to active device source/drain regions within die 116. Conventional processing may be employed for forming active region contact 124 during fabrication of devices within active region 126. Active region contact 124 may be connected to a device within active region 124 by an interconnect 128 within the same metallization level, or by one or more vias 132a to an interconnect 132b in a higher metallization level. A passivation material 128 overlies active region 126, including active region contact 124.

An opening 132 is etched at the die edge from the die backside through a base region 134 of the die substrate which underlies the active region 126, providing structural integrity for die 116 and grounding for active devices within active region 126. An oxide or nitride hard mask may be employed to selectively etch the opening 132. Opening 132 exposes a portion of active region contact 124 at the die edge, which may be as little as a 5 μm wide strip of active region contact 124. An insulating layer 136 is formed on the sidewall of opening 132 and on the backside surface of die 116. Insulating layer 136 may be formed by depositing a dielectric material such as silicon dioxide ($SiO_2$) uniformly over the backside of die 116 by chemical vapor deposition (CVD) or plasma-enhanced chemical vapor deposition (PECVD), then patterning and etching the dielectric material to expose the portion of active region contact 124. A backside contact interconnect 138 is formed on a sidewall of the opening 132 and on the backside surface of die 116 to connect backside die contact pad 140 to active region contact 124. Backside contact interconnect 138 may be as narrow as approximately 1.5 μm wide, while backside die contact pad 140 may be square of approximately 50–80 μm on a side. The metal employed for forming backside contact interconnect 138 and backside contact pad 140 may be silver (Ag) formed by electrolytic methods and patterned in accordance with known processes. See, e.g., commonly assigned copending U.S. patent application Ser. No. 09/102,431, entitled "SILVER METALLIZATION BY DAMASCENE METHOD" and filed Jun. 22, 1998, which is incorporated herein by reference.

Opening 132 may be formed by any process which can etch silicon, including chemical etch, reactive ion etch (RIE), or laser etch. However, since base region 134 of die 116 is typically about 350 µm thick, problems will arise in the formation of backside contact interconnect 138 on the sidewall of opening 132 unless opening 132 is formed with a sloped sidewall. If opening 132 is formed with a significantly sloped sidewall, conventional aluminum (Al) or aluminum-alloy metal deposition and patterning methods may be utilized for forming backside contact interconnect 138 and backside contact pad 140. In the preferred embodiment, therefore, die 116 is formed in <100> silicon and a potassium hydroxide (KOH) based wet etch is employed to form opening 132. KOH-based etching in <100> silicon is known to remove the silicon along crystal planes, resulting in a tetrahedral opening having the shape of an inverted, four-sided pyramid with sidewalls at an angle of 54.7° with the major surface of the substrate. This is sufficiently sloped to permit utilization of aluminum deposition and patterning methods for formation of backside contact interconnect 138.

Figure 2:
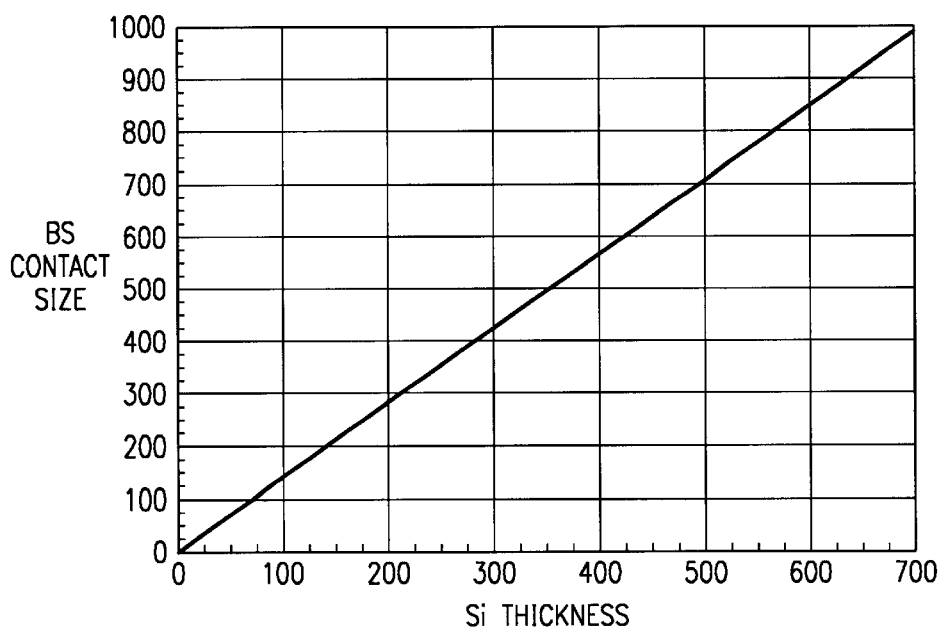
FIG. 2 is a graph of minimum required backside contact opening width as a function of opening depth in forming a backside contact opening in accordance with a preferred embodiment of the present invention.

Since the sidewall of opening 132 is angled, the required size of opening 132 at the backside surface of die 116 depends on the depth of opening 132. For a base region 134 having a thickness of 350 µm, the minimum required width for opening 132 to extend through base region 134 is 350 µm×tan 54.7≈°500 µm. Thus, in order to expose a 5 µm wide portion of active region contact, the width of opening 132 at the backside surface of die 116 should be 505 µm. FIG. 2 is a graph of the minimum backside contact opening width as a function of the silicon thickness through which the opening extends. The sizes given are merely for forming an opening through the corresponding thickness of silicon, and must be increased by the size of the region to be exposed at the bottom of the opening. Additionally, the sizes specified are merely the distance from the edge of die 116 to which the opening must extend. If opening 132 were formed in the body of die 116 rather than at the edge, the required contact opening size listed must be doubled. Thus, the required total width of opening 132 in the body of die 116 necessary to extend through a thickness of 350 µm of silicon and expose a 5 µm portion of active region contact 124 would be 1005 µm. Opening 132 is therefore formed at the edge of die 116 in order to loose less backside surface area space to formation of the opening 132.

Figure 3A:
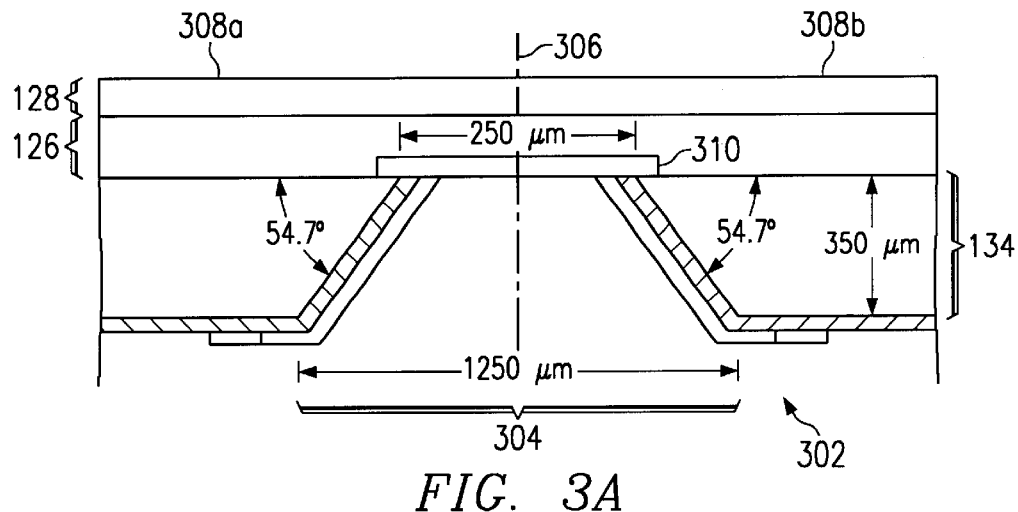
FIGS. 3A–3C depict cross-sectional views of a shared backside contact opening in accordance with a preferred embodiment of the present invention.
Figure 3B:
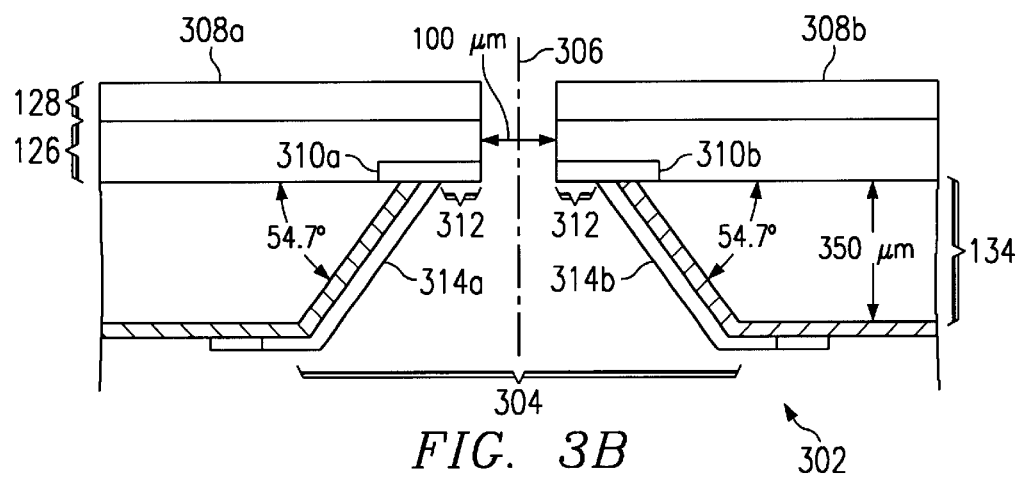
Figure 3C:
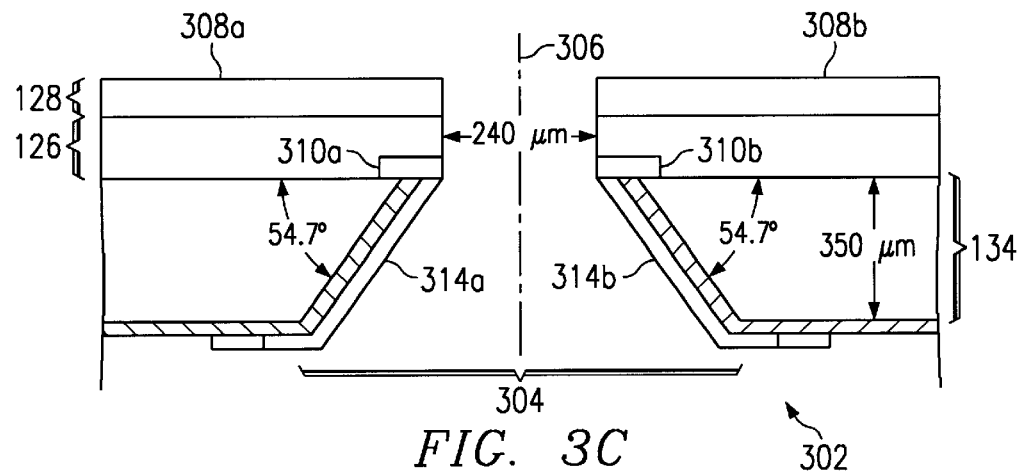

Referring to FIGS. 3A through 3C, cross-sectional views of a shared backside contact opening in accordance with a preferred embodiment of the present invention are depicted. FIG. 3A depicts formation of the backside contact opening within a single substrate 302 containing multiple die. In practice, the backside contact opening 304 is preferably formed across the logical boundary 306 between two die 308a and 308b within a single substrate 302, sharing the opening between the two die. The width of the active region contact 310 at the bottom of the opening in a direction across the logical boundary is at least the kerf dimension of the device to be employed to separate the two die (e.g., saw or scribe), plus the required width of the contact area needed for conductive lines formed on the sidewalls of opening 304 to connect active region contact 310 to contact pads on the backside surface of the substrate. In the exemplary embodiment, active region contact is at least 250 µm in width. Opening 304 in the exemplary embodiment is 1250 µm wide at the backside surface of substrate 302, 250 µm wide at the bottom, and 350 µm deep.

A portion of opening 304 is thus formed within each die 308a and 308b, reducing the amount of backside surface area space consumed by opening 304 on any one die. When die 308a and 308b are separated, a portion of opening 304 remains at the edge of each die. The active region contact 310 for both die is also preferably formed as a single structure spanning the logical boundary 306 between die 308a and 308b. A backside contact interconnect may then be formed on two sidewalls of opening 304 to contact active region contact 310 on each side of opening 304. When the die 308a and 308b are separated, a portion of active region contact 310 will remain with each die together with the backside contact interconnect.

FIG. 3B depicts the shared contact opening after the die have been separated in a first manner. The presence of a significant number of contact openings along the boundary between two die (42 contact openings along each die edge for sensor circuit 102) has the effect of "perforating" the boundary between the two die. That is, the contact openings reduce the average thickness of substrate 302 along the die boundary 306, weakening the structure along that boundary. Therefore, it may be possible to separate die 308a and 308b utilizing a scribe along the die boundary 306 to further weaken the structural integrity of substrate 302 at that point, then simply break the die apart.

A typical scribe will have a point width of approximately 100 µm. Separation of die 308a and 308b of the exemplary embodiment in this fashion will result in protrusions 312 remaining at the edge of each die 308a and 308b where separated. This may be desirable as a margin of safety against "clipping" the backside contact interconnect 314a, 314b at the crucial connection point with active region contact 310a, 310b. Such protrusions 312 may be left by other means of separating die 308a and 308b if opening 304 is formed with a width at the bottom which is in excess of the width consumed by the mechanism for separating the two die. For example, if a saw is employed to separate the two die 308a and 308b, the width of opening 304 at the bottom must exceed the width of the silicon consumed by the saw blade (the kerf) to leave protrusions 312.

FIG. 3C depicts the shared contact opening after the die have been separated in an alternative manner. In this embodiment, die 308a and 308b are separated by a saw having a width of 240 µm, leaving 5 µm of opening 304 on each side for the contact between the backside contact interconnect 314a, 314b and the corresponding active region contact 310a, 310b. While the possibility of clipping the connection between the backside contact interconnect 314a, 314b and the corresponding active region contact 310a, 310b is much greater without a margin of excess width at the bottom of opening 304, the sloped sidewalls of opening 304 act to some extent as a guide for the saw blade, keeping the blade aligned with the unused portion of the bottom of opening 304.

Figure 4:
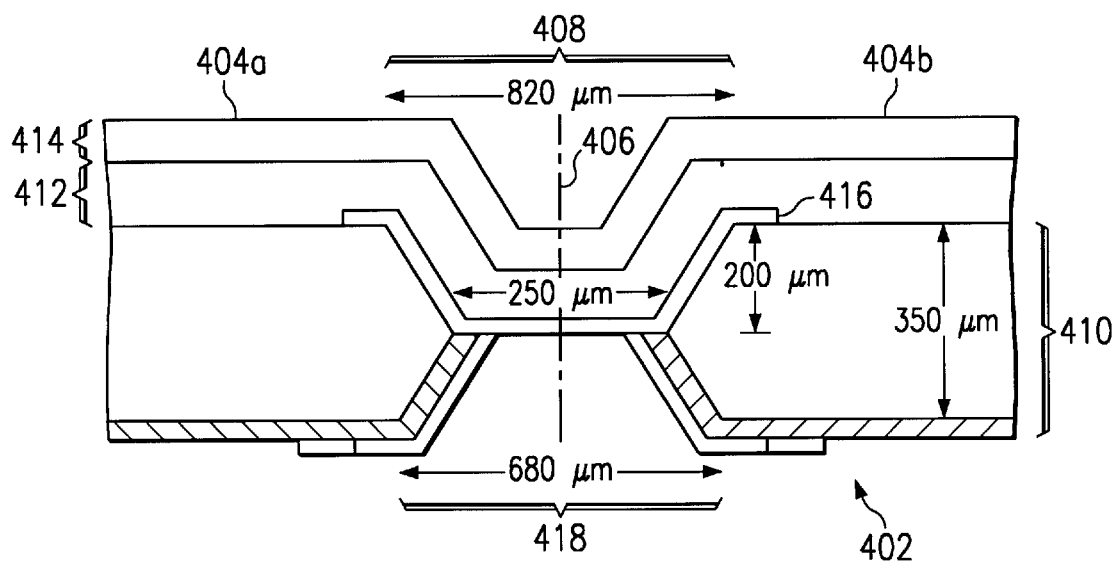
FIG. 4 is an alternative embodiment of a backside contact in accordance with a preferred embodiment of the present invention.

Referring to FIG. 4, an alternative embodiment of a backside contact in accordance with a preferred embodiment of the present invention is illustrated. On a single substrate 402 including two die 404a and 404b, the backside contact formed spanning across the logical boundary 406 between the two die 404a and 404b. In order to reduce the width for the backside contact opening required at the backside surface of each die for a given thickness of silicon, a front side contact opening 408 is first etched into the front side of substrate 402 into base region 410 prior to formation of active region 412 and passivation material 414. A KOH-based etch is preferably utilized to form front side opening 408, resulting in the same sloped sidewalls previously described.

In the example shown, front side opening 408 is etched to a depth of 200 µm. Active region contact 416 is then formed on the substrate 402 within front side opening 408 and over adjacent regions. Active region contact 416, together with active region 412 and passivation material 416, are formed conformally with substrate 402 in the region of front side opening 408. After the active devices within active region 412 and passivation material 414 are formed, backside contact opening 418 is etched. Since a depth of only 150 µm is required, backside contact opening 418 need only have a width of 680 µm at the backside surface of substrate 402. A backside contact interconnect and backside die contact pads are then formed, and die 404a and 404b are separated, as described above.

Figure 5:
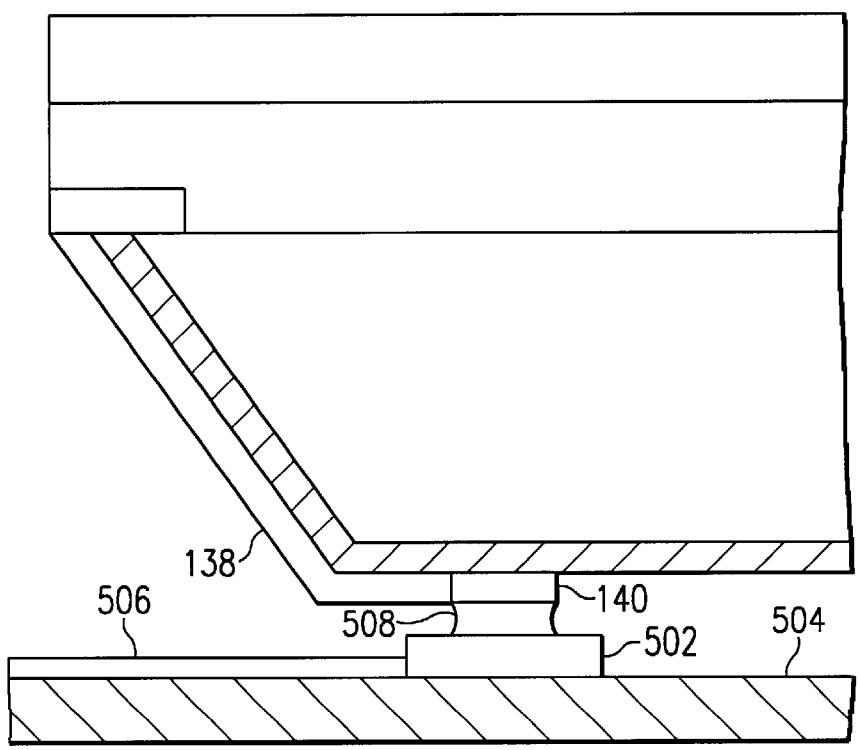
FIG. 5 depicts use of a backside contact in a packaged integrated circuit in accordance with a preferred embodiment of the present invention.

With reference now to FIG. 5, use of a backside contact in a packaged integrated circuit in accordance with a preferred embodiment of the present invention is depicted. During packaging, backside die contact pad 140 is electrically connected with a contact region 502 on the package 504, on which a connector 506 electrically connects the contact region 502 to a pin or to other circuitry. Package 504 may be any type of package suitable for use with integrated circuits, including a printed circuit board (PCB) package with a ball grid array (BGA) of contacts connected to pins, a lead-frame encapsulated in a plastic resin, or a credit card-type package. Direct contact between backside die contact pad 140 and contact region 502 may be employed, or electrical contact may be facilitated by a material 508 such as conductive epoxy, solder, or the like. A resin (not shown) may be employed to hold the integrated circuit die include backside die contact pad 140 on package 504.

Although described in the exemplary embodiment in the context of capacitive sensor circuits, the backside contacts in accordance with the present invention may be employed with integrated circuits of any type. The present invention eliminates the need for a pad etch during processing on the front side of a substrate, and need not add to the masks employed in forming devices on the front side. The backside contact allows direct placement of the integrated circuit die on contacts within the packaging, eliminating the need for wire bonds. Contact pads need not be placed near the periphery of a die, but may be placed anywhere on the die surface. By forming shared contacts between two die, surface area consumed by the backside contact opening is minimized.

While the invention has been particularly shown and described with reference to a preferred embodiment, it will be understood by those skilled in the art that various changes in form and detail may be made therein without departing from the spirit and scope of the invention.

What is claimed is:

1. An integrated circuit structure, comprising:
   a contact within an active portion of a substrate extending across a boundary between two integrated circuit die;
   an opening in a back side of the substrate spanning the boundary and exposing a portion of the contact on both sides of the boundary;
   first and second conductive lines on sidewalls of the opening, the first and second conductive lines each extending, on opposite sides of the boundary, from the exposed portion of the contact to a backside surface of the substrate adjacent the opening; and
   first and second contact pads on the backside surface of the substrate on opposite sides of the boundary, the first and second contact pads electrically connecting to the first and second conductive lines, respectively.

2. The integrated circuit structure of claim 1, wherein the contact has a width, extending in a direction across the boundary, exceeding a kerf of a device to be employed in separating the two integrated circuit die along the boundary through the contact.

3. The integrated circuit structure of claim 1, wherein the opening has sloped sidewalls and a depth at least equal to the distance between the contact and the backside surface of the substrate.

4. The integrated circuit structure of claim 1, further comprising:
   a dielectric on the sidewalls of the opening and the backside surface of the substrate between the substrate and the conductive lines and between the substrate and the backside contact pads.

5. The integrated circuit structure of claim 1, further comprising:
   a scribe line on the substrate along the boundary.

6. The integrated circuit structure of claim 1, further comprising:
   a sawed region in the substrate along the boundary.

7. The integrated circuit structure of claim 2, wherein the contact has a width equal to the kerf of a scribe, a margin for preventing clipping of contacts on each side of the boundary, and a required contact area.

8. The integrated circuit structure of claim 2, wherein the contact has a width equal to the kerf of a saw and twice a required contact area.

9. The integrated circuit structure of claim 3, wherein the opening is etched with a KOH-based etch in <100>silicon.

10. An integrated circuit device, comprising:
    an active region contact in an active portion of a die extending from an edge of the die inward;
    an opening in a back side of the die exposing a portion of the active region contact at the edge;
    a conductive line on a sidewall of the opening extending from the exposed portion of the active region contact to a backside surface of the die adjacent the opening; and
    a contact pad on the backside surface of the die and electrically connected to the active region contact through the conductive line.

11. The integrated circuit device of claim 10, further comprising:
    a package containing the die, the package including a package contact electrically connected to the contact pad on the backside surface of the die.

12. The integrated circuit device of claim 10, wherein the opening extends to the edge of the die.

13. The integrated circuit device of claim 10, wherein an end of the conductive line contacting the contact within the opening extends to the edge of the die.

14. The integrated circuit device of claim 10, wherein an end of the conductive line contacting the contact within the opening is spaced apart from the edge of the die.

15. An integrated circuit structure, comprising:
    one or more contacts within an active portion of a substrate extending across a boundary between two integrated circuit die;
    a contact opening in a back side of the substrate spanning the boundary and exposing a portion of each of the contacts on both sides of the boundary;
    for each of the contacts:
       first and second conductive lines on sidewalls of the opening for each of the contacts, the first and second conductive lines each extending, on opposite sides of the boundary, from the exposed portion of a contact to a backside surface of the substrate adjacent the opening; and first and second contact pads on the backside surface of the substrate on opposite sides of the boundary, the first and second contact pads electrically connecting to the first and second conductive lines, respectively; and a separation opening extending from a bottom of the contact opening through the active portion of the substrate along at least a portion of the boundary, the separation opening separating each contact intersected into two portions.

16. The integrated circuit structure of claim 15, wherein the separation opening has a width which is less than a width of the bottom of the contact opening.

17. The integrated circuit structure of claim 15, wherein the separation opening has a width which is approximately equal to a width of the bottom of the contact opening.

18. The integrated circuit structure of claim 15, wherein the separation opening has a width which is equal to a kerf of a device employed in forming the separation opening.

19. The integrated circuit structure of claim 15, wherein the separation opening extends to an edge of each conductive line.

20. The integrated circuit structure of claim 15, wherein the separation opening is spaced apart from each conductive line.

* * * * *